(12) United States Patent
Rosenthal et al.

(10) Patent No.: US 7,719,446 B2
(45) Date of Patent: May 18, 2010

(54) METHOD AND APPARATUS FOR COMPUTING INTERPOLATION FACTORS IN SAMPLE RATE CONVERSION SYSTEMS

(75) Inventors: Daniel A. Rosenthal, Boxford, MA (US); Corey A. Nazarian, Cambridge, MA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 12/271,436

(22) Filed: Nov. 14, 2008

(65) Prior Publication Data

US 2009/0128379 A1 May 21, 2009

Related U.S. Application Data

(60) Provisional application No. 60/988,772, filed on Nov. 16, 2007.

(51) Int. Cl.
*H03M 7/00* (2006.01)
(52) U.S. Cl. .................... 341/61; 375/355; 708/313
(58) Field of Classification Search ............... 341/61; 708/313
See application file for complete search history.

(56) References Cited

U.S. PATENT DOCUMENTS

| 6,000,834 | A | 12/1999 | Duan |
| 6,005,901 | A * | 12/1999 | Linz ........................... 375/355 |
| 6,462,682 | B2 * | 10/2002 | Hellberg ...................... 341/61 |
| 6,847,313 | B2 * | 1/2005 | Biswas ........................ 341/61 |
| 7,062,241 | B2 | 6/2006 | Kruger et al. |
| 7,259,700 | B2 | 8/2007 | Heeb |
| 7,280,061 | B2 | 10/2007 | Dias |

OTHER PUBLICATIONS

Introduction to Digital Signal Processing, J.G. Prokais et al., 2nd Edition, 1992.
When "Almost" Is Good Enough: A Fresh Look at DSP Clock Rates, Rosenfeld et al., 1998.
International Search Report and Written Opinion for Application No. PCT/US2008/083619 mailed on Apr. 30, 2009.

* cited by examiner

*Primary Examiner*—Khai M Nguyen
(74) *Attorney, Agent, or Firm*—Wolf, Greenfield & Sacks, P.C.

(57) ABSTRACT

The invention allows the interpolation factor, a critical parameter in sample rate conversion systems, to be computed in a real-time system where there is a complex relationship between a DSP clock and the data clocks. Typically, two or three of the clocks in such a system will have simple relationships (such as $CLOCK_1 = 2*CLOCK_2$). This relationship leads to degenerate cases where, in fact, there are only one or two clocks to consider rather than three. Furthermore, the invention allows for input data rates that are higher than the DSP clock rate. The invention also provides for an arbitrary time delay to be applied to the output signal.

21 Claims, 12 Drawing Sheets

Interpolation Factor Calculation Multiplicand Bit Mapping

METHOD AND APPARATUS FOR COMPUTING INTERPOLATION FACTORS IN SAMPLE RATE CONVERSION SYSTEMS

RELATED APPLICATIONS

This application claims the benefit of priority to U.S. Provisional Patent Application Ser. No. 60/988,772, filed Nov. 16, 2007, the entire contents of which are incorporated herein by reference.

FIELD OF THE INVENTION

This invention relates generally to digital signal processing and more particularly to converting a digital signal at a first sampling rate to a representation of the same digital signal at a second sampling rate.

BACKGROUND OF THE INVENTION

In many electronic applications, signals are represented and processed digitally. Digital words, or samples, represent the value of the signal at a regular time interval. This regular interval is often referred to as the sample rate, and is typically expressed in units of Hertz (Hz) representing the reciprocal of the sample interval time period. The signal thus represented can have no energy above half the sample rate; the frequency equal to half the sample rate is called the Nyquist frequency.

Digital sample rate conversion is used in many types of digital systems. For example, audio signals, such as might be generated in making recordings of music, are often processed digitally. The various pieces of equipment used to process and record the signals will not always operate at the same sampling frequency. As a result, it is often necessary that each piece of equipment accept a digital signal sampled at a first rate and then convert it to a digital signal with a second sampling rate before processing it. Of course, the information content of the signal must not be appreciably changed by the sample rate conversion or the sound quality of the signal will be degraded.

A very simple way to accomplish sample rate conversion is to simply drop out samples from the first signal. The output waveform thus has fewer samples per second and therefore has a lower sample rate. Assuming the Nyquist criterion is met in the output signal, it is an accurate representation of the same signal as the input. This process is referred to generally as "decimation." It is limited, though, to situations in which the sampling rate of the input is an integer multiple of the sampling rate of the output.

A process called interpolation may be used when the sampling rate of the output is intended to be an integer multiple higher than the sampling rate of the input signal. In such an interpolation operation, an intermediate signal can be first produced by filling the time between samples of the input signal with samples which are arbitrarily assigned the value of zero. Such an intermediate signal is called a "zero-stuffed" signal. Because samples are added while the time span is kept the same, the zero-stuffed signal has a higher sampling rate than the input signal. The higher frequency zero-stuffed signal can be filtered in a digital interpolation filter that smoothes out the discontinuities caused by adding the extra samples. The result is a digital signal which has the same shape as the input signal, but contains more samples per second.

The processes of decimation and interpolation may be combined. For example, a circuit could decimate by a factor of D and interpolate by a factor of I. The resulting output would have a sampling rate in a ratio of I/D to the input sampling rate. Such a circuit is, however, limited to scaling the sampling rate by a rational number. More importantly, for a digital system, there are practical limits on the ranges of values for D and I. The decimation factor D can not be so large that the decimated signal no longer satisfies the Nyquist rate. Additionally, the interpolation factor I cannot be made arbitrarily large, because the required complexity of the interpolation filter increases as I gets larger (e.g., more taps). Moreover, it is presumed that at least one of the different clocks is essentially identical to the system clock (i.e., DSP clock), or at least related to it in a straightforward manner, such as by a factor of 2. Maintaining consistency between the different sample rate clocks in such situations places a burden on the accuracy and complexity of the hardware of the timing system.

SUMMARY OF THE INVENTION

An ability to process data accurately in a three clock system allows for simplification of the requirements for real analog clock generation by adding complexity to the digital signal processing. In general, reductions in analog complexity are desirable because they lead to increased system reliability, greater flexibility of functionality, and lower system cost.

Described herein are systems and processes that allow the interpolation factor p, a critical parameter in sample rate conversion systems, to be computed in a real-time system where there is a complex relationship between a DSP clock and the data clocks. Typically, two or three of the clocks in such a system will have simple relationships (such as clock 1=2*clock 2). This relationship leads to degenerate cases where, in fact, there are only two clocks to consider. Furthermore, the systems and processes described herein allow for such computation of the interpolation factor to occur with input data rates that are higher than the DSP clock rate. In at least some embodiments, an arbitrary time delay can be applied to the output signal.

One embodiment of the invention relates to a process for rate-converting sampled data. Input data sampled according to an input sample clock is received. A value indicative of an output sample clock differing from the input sample clock by a value that need not be an integer is also received. Respective relationships are determined between each of the input and output sample clocks and a processor clock. Each of the input and output clocks are independent from the processor clock. An interpolation factor is determined as a function of the input sample clock, the output sample clock, and the processor clock. Output data is generated as a function of the input data and the interpolation factor, wherein the output data corresponds to the input data sampled according to the output sample clock.

Another embodiment of the invention relates to a system for converting sampled data from a first data rate to a second data rate. This includes a rate converter for receiving input data sampled according to an input sample clock and configured to produce output data indicative of the input data sampled according to an output sample clock. The rate converter operates at a processing clock rate that is independent from either of the input sample clock and the output sample clock. An accumulator receiving the processing clock is configured to monitor a sate of the processor clock and to determine respective relationships of each of the input sample clock and the output sample clock to the processor clock. The system also includes an interpolation factor circuit in communication with the accumulator and the rate converter. The interpolation factor circuit is configured to receive from the accumulator the respective relationships of each of the input sample clock and the output sample clock to the processor clock. The interpolation factor circuit is also configured to calculate an interpolation factor as a function of the input sample clock, the output sample clock, and processor clock. The rate converter is configured to convert the input data to the output data as a function of the interpolation factor.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Figure 1:
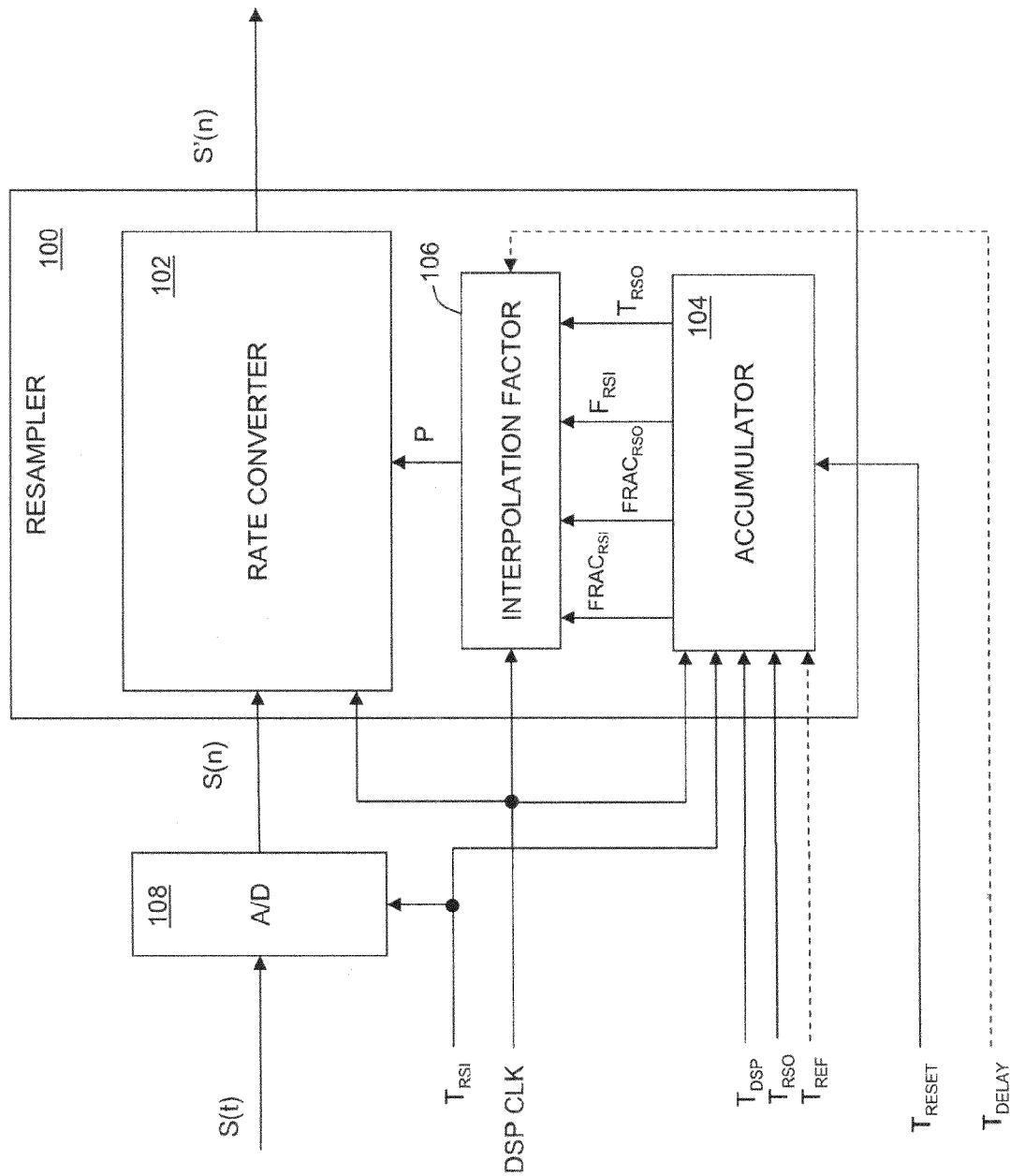
FIG. 1 is a block diagram illustrating a digitizer combined with an embodiment of a sample rate converter.

Systems and processes for converting data at one sample rate to data at a second sample rate are described herein. In the prior art, implementations of sample rate conversion systems employ a digital signal processing clock that is equal to, or directly related to, as in an integer multiple of, the output sample rate. Beneficially, in the system and techniques described herein allow for a system processing clock having non-trivial M/N relationship to the output sample rate. For example, M and N can be very large integers. In at least some embodiments, a programmable time delay (having arbitrary range and resolution) can also be applied to the output signal.

In general, the techniques described herein can be applied to any real-time system having fixed converter frequencies, variable (or even fixed, but different) signal data rates. Use of the term converters, generally includes analog-to-digital converters (ADC) and digital-to-analog converters (DAC), depending upon the particular application. For example, in a source mode, a DAC provides an analog output stimulus signal, obtained from a synthesized digital representation of the stimulus signal. Alternatively, in a detector mode, an ADC converts a received analog response signal, as may be obtained from a device under test, to a digital representation of the received response signal for further processing from a test system. In either instance, a third system clock frequency would likely be employed, for example, controlling the DSP, that need not be related to either of the converter frequency or the signal data rate. Other applications include sample rate conversion systems in which the known converter sample rate is unrelated to the known system or processing clock.

Sample rate conversion techniques as described herein allow users to define baseband waveforms at a rate (i.e., timing) having a wide range and fine resolution relative to a fixed clock rate at which the actual converters operate (e.g., the converter clock rate). This sample rate conversion can be accomplished by determining a non-integer interpolation factor based on relationships among the three different clocks: converter clock; user clock; and system, or DSP clock. The interpolation factor is used by an interpolation filter. Exemplary interpolator filters include a polyphase, finite-impulse-response (FIR) filter and linear interpolator on the source, and a combination of a polyphase FIR filter, linear interpolator, and decimating FIR filters on the digitizer. These filter configurations yield a desired rate conversion within a system running at an unrelated processor or DSP clock rate.

Operation of the re-sampler is essentially transparent to the user so that the re-sampler instrument behaves as if it contained a conventional arbitrary waveform generator and digitizer with the converters operating at one of the input or output clock rates. Thus, the re-sampler knows nothing of special events, such as a start command, user clock reset commands, and the like, sample sizes, or signal content other than bandwidth restrictions. All errors introduced by the re-sampling process will be below the spurious free dynamic range specification. The re-sampler is fairly flexible in terms of input and output frequencies; the re-sampling ratios are driven by an external virtual clock generator which could be customized for different clocking scenarios.

Referring to FIG. 1, a block diagram of an exemplary embodiment of a re-sampler 100 according to the present invention includes a rate converter 102, an accumulator 104, and an interpolation factor module 106. Also illustrated is an A/D converter 108 coupled to an input of the re-sampler 100. The A/D converter 108 receives an input analog signal S(t) and samples it according to an input sample rate, or converter clock, referred to herein as a first clock domain. A period of the input sample cycle is illustrated as $T_{RSI}$. The rate converter 102 receives the sampled, digital representation of the input signal S(n) in the first converter clock domain and converts it to an output representation of the same input signal, but in a second user clock domain. Generally, the second clock domain has an output sample rate that is different from the first. A period of the output sample cycle is illustrated as $T_{RSO}$. The two clock domains are, for all practical purposes unrelated. In reality, they may vary by a non-integer ratio of two very large numbers. An important advantage offered by the present invention is that the rate converter 102 is operating according to yet another process clock, referred to herein as a third clock domain, referred to as a system, or DSP clock domain. A period of the processor sample cycle is illustrated as $T_{DSP}$.

The accumulator 104 receives, or is pre-loaded with several values. One such value is representative of the output sample rate. In the example, this value is the period of the output sample rate $T_{RSO}$. Alternatively or in addition, the accumulator 104 could have been pre-loaded with the output sample frequency $F_{RSO}$ (i.e., the inverse of $T_{RSO}$). Another such pre-loaded value is representative of the input sample rate. In the example, this value is the period of the input sample rate $T_{RSI}$ (or input sample frequency, $F_{RSI}$). Yet another value that can be pre-loaded into the accumulator 104 is a period of the processor clock, $T_{DSP}$ (or processor clock frequency, $F_{DSP}$).

The accumulator 104 processes one or more of the pre-loaded values at the processor clock rate (DSP CLK) to produce several output values. Primarily, the output values include fractional values indicative of a relationship between the different clock domains. One such fractional value $FRAC_{RSI}$ is obtained from a relationship of the input sample clock to the processor clock. Another such fractional value $FRAC_{RSO}$ is obtained from a relationship of the output sample clock to the processor clock. One or more of the period and frequency of the input and output clocks ($T_{RSI}$, $F_{RSO}$, $T_{RSO}$, $F_{RSO}$) can also be provided as output values. In the illustrative embodiment, the accumulator provides $F_{RSI}$ and $T_{RSO}$ as output values. In some embodiments, the accumulator 104 also receives one or more additional inputs, such as an external timing reference $T_{REF}$ and a reset signal $T_{RESET}$. The accumulator 104 can periodically update the output values $FRAC_{RSI}$, $FRAC_{RSO}$, $F_{RSI}$, $T_{RSO}$. For example, in some embodiments, the output values are updated by the accumulator 104 during each cycle of the processor clock, $T_{DSP}$.

The interpolation factor module, or circuit 106 receives the output values $FRAC_{RSI}$, $FRAC_{RSO}$, $F_{RSI}$, $T_{RSO}$ from the accumulator 104 and derives an interpolation factor p from one or more of the received values. The interpolation factor module 106 can also process one or more of the inputs to generate an output according to the processor clock, $T_{DSP}$. The rate converter 102 receives the interpolation factor p from the interpolation factor module 106 and uses this value to accomplish the desired sample rate conversion.

In some embodiments, the interpolation factor module 106 also receives a delay input value, $T_{DELAY}$. The delay value can be provided by a user to introduce a skew between the different clock domains. The delay value can also be used to arbitrarily delay the output sampled signal with respect to the input sampled signal. The maximum delay that can be accommodated by a realizable system will depend at least to some extent upon provisions of the particular embodiment. For example, a look-ahead buffer can be included to accommodate such delayed values, as described in more detail below. In such embodiments, the depth of the look-ahead buffer can be determined based on the longest anticipated delay. Longer delays require deeper look-ahead buffers.

Figure 2:
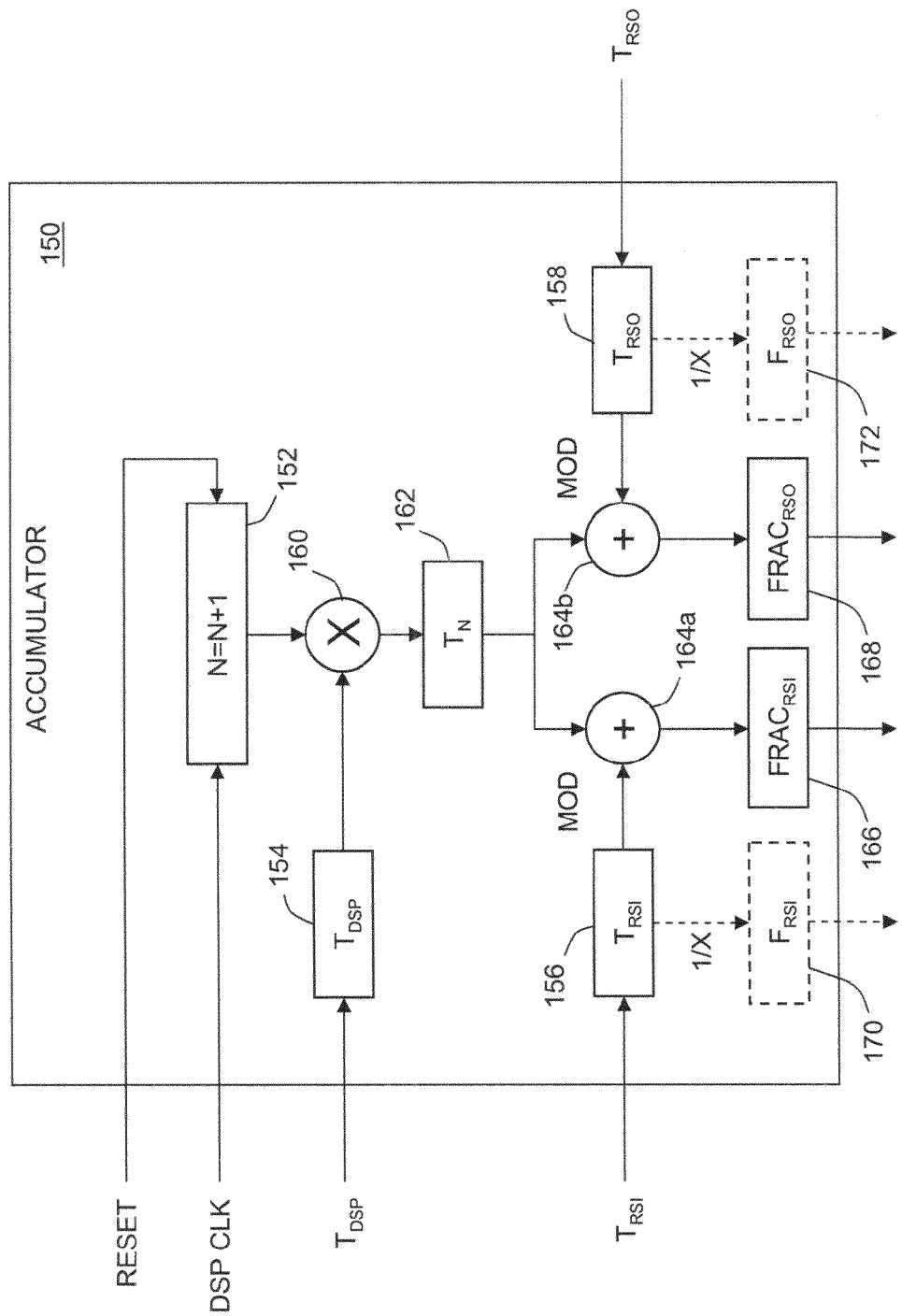
FIG. 2 is a block diagram illustrating in more detail an embodiment of an accumulator as may be used in a sample rate converter.

Referring to FIG. 2, an exemplary embodiment of an accumulator 150 according to the present invention, such as the accumulator 104 shown in FIG. 1, includes an accumulating register 152. The accumulating register 152 stores a value N that is incremented with each processor clock cycle. The value of N can be a binary integer that is incremented by one after each processor clock cycle. The value of N may be reset to zero or another value upon receipt of a reset signal RESET at a reset input. The accumulator 150 also includes registers for storing various values, such as a processor register 154 for storing a value indicative of the processor clock period $T_{DSP}$, an input clock domain register 156 for storing a value indicative of the input sample period $T_{RSI}$, and an output clock domain register 158 for storing a value indicative of the output sample period $T_{RSO}$. The values of the accumulating register 152 and the processor clock period $T_{DSP}$ are fed to a multiplier 160 that multiplies the values together and stores the resulting value $T_N$ in a processor time register 162. The stored processor time value $T_N$ is fed to a first modulo arithmetic processor 164a together with the $T_{RSI}$ value stored in the input clock domain register 156. The result of the first modulo operation is $FRAC_{RSI}$, a fractional portion of the ratio of the two values: $T_N$ and $T_{RSI}$. The resulting value $FRAC_{RSI}$ is stored in an input phase difference register 166. Similarly, the stored processor time value $T_N$ is also fed to a second modulo arithmetic processor 164b together with the $T_{RSO}$ value stored in the output clock domain register 158. The result of the second modulo operation is $FRAC_{RSO}$, a fractional portion of the ratio of the two values: $T_N$ and $T_{RSO}$. The resulting value $FRAC_{RSO}$ is stored in an output phase difference register 168.

In some embodiments, an inverse of the value stored in the input clock domain register 156 is stored in an input clock domain frequency register 170. Similarly, in some embodiments, an inverse value stored in the output clock domain register 158 is stored in an output clock domain frequency register 172. One or more of the stored register values $FRAC_{RSI}$, $FRAC_{RSO}$, $F_{RSI}$, $F_{RSO}$, can be forwarded to the interpolation factor module 106 (FIG. 1). In the illustrative embodiment, four values are forwarded to the interpolation factor module 106: $FRAC_{RSI}$, $FRAC_{RSO}$, $F_{RSI}$, and $T_{RSO}$.

Figure 3:
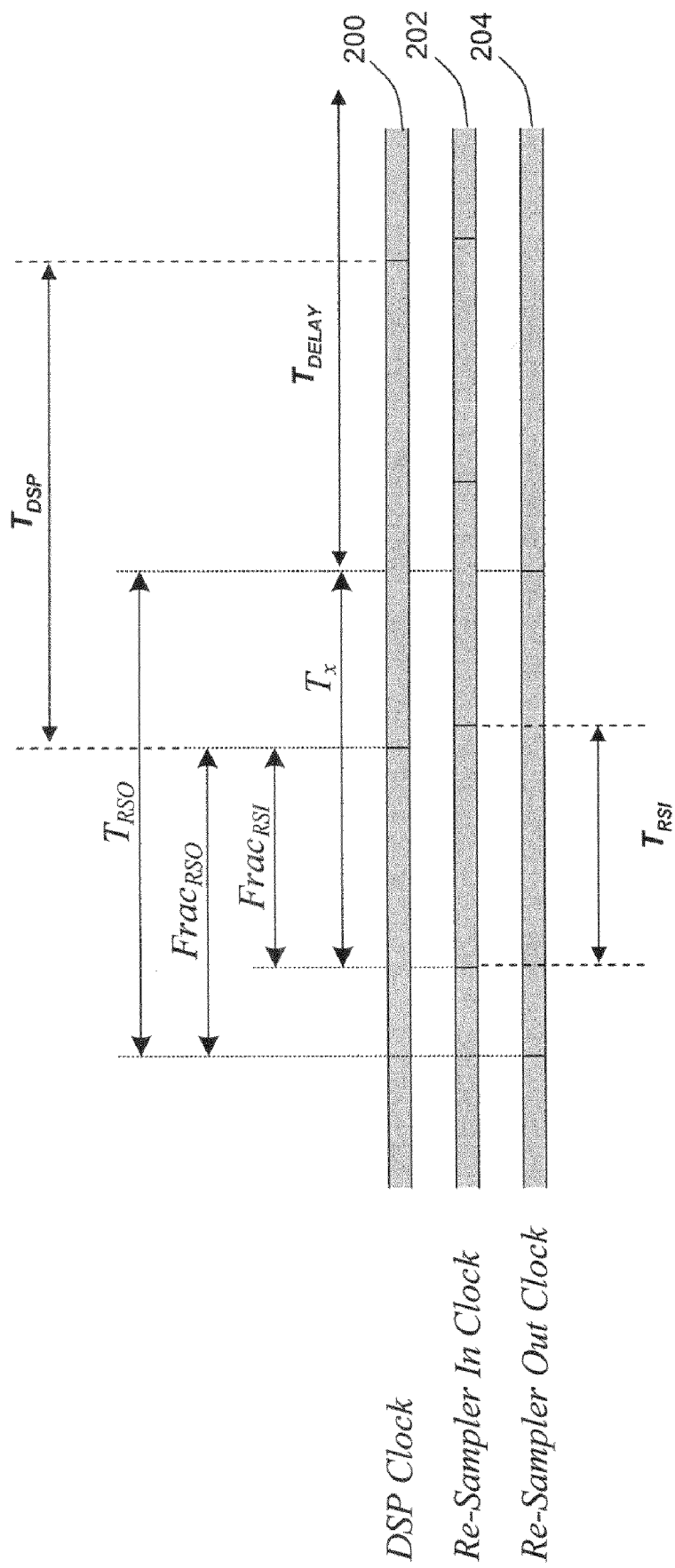
FIG. 3 is a timing diagram illustrating a relationship between different clock signals within an embodiment of a sample rate converter.

A timing diagram illustrating an exemplary relationship between different timing signals according to the present invention is illustrated in FIG. 3. The diagram shows a possible relationship between the three clocks of interest (although the process described applies to arbitrary relationships between the clocks). In particular, a portion of a processor clock 200, sometimes referred to as a DSP clock, is illustrated having a period $T_{DSP}$. Just below the DSP clock, an overlapping portion of an input sample clock 202, sometimes referred to as a re-sampler in clock, is illustrated having a period $T_{RSI}$. Finally, an overlapping portion of an output sample clock 204, sometimes referred to as a re-sampler out clock, is illustrated at the bottom of the figure having a period $T_{RSO}$.

The FRAC term is used to describe the time measured from an event to the next clock cycle, as opposed to a "residual," which by some conventions refers to the time looking forward from a clock cycle to the next event. The FRAC values are provided with respect to the DSP clock obtained from a clock generator section, described in more detail below. Thus, $FRAC_{RSI}$ is the time from a re-sampler in clock event looking forward to the next DSP clock event. Similarly, $FRAC_{RSO}$ is the time from a re-sampler out clock event looking forward to the next DSP clock event.

In some embodiments, the interpolation factor calculation module 106 (FIG. 1) calculates the interpolation factor p from the $FRAC_{RSI}$ value of the converter clock (re-sampler input, $T_{RSI}$), and the $FRAC_{RSO}$ of the user clock (re-sampler output, $T_{RSO}$). The interpolation factor is defined by $$p = Tx/T_{RSI} \quad (1)$$

Tx is derived from the FRAC values by $$Tx = T_{RSO} - (FRAC_{RSO} - FRAC_{RSI}) \quad (2)$$

as can be observed from the relative arrangement of clock signals illustrated in FIG. 3.

The value of p, the interpolation factor, can be derived from the re-sampler input and re-sampler output time accumulator $FRAC_{RSI}$ and $FRAC_{RSO}$ values:

$$p = \frac{T_{RSO} - Frac_{RSO} + Frac_{RSI} + T_{DELAY}}{T_{RSI}}, \quad (3)$$

in which $T_{DELAY}$ is an arbitrary delay that may be introduced according to an intended application;

$$Frac_{RSO} = T_N \oplus T_{RSO}; \text{ and} \quad (4)$$

$$FRAC_{RSI} = T_N \oplus T_{RSI}. \quad (5)$$

Figure 4:
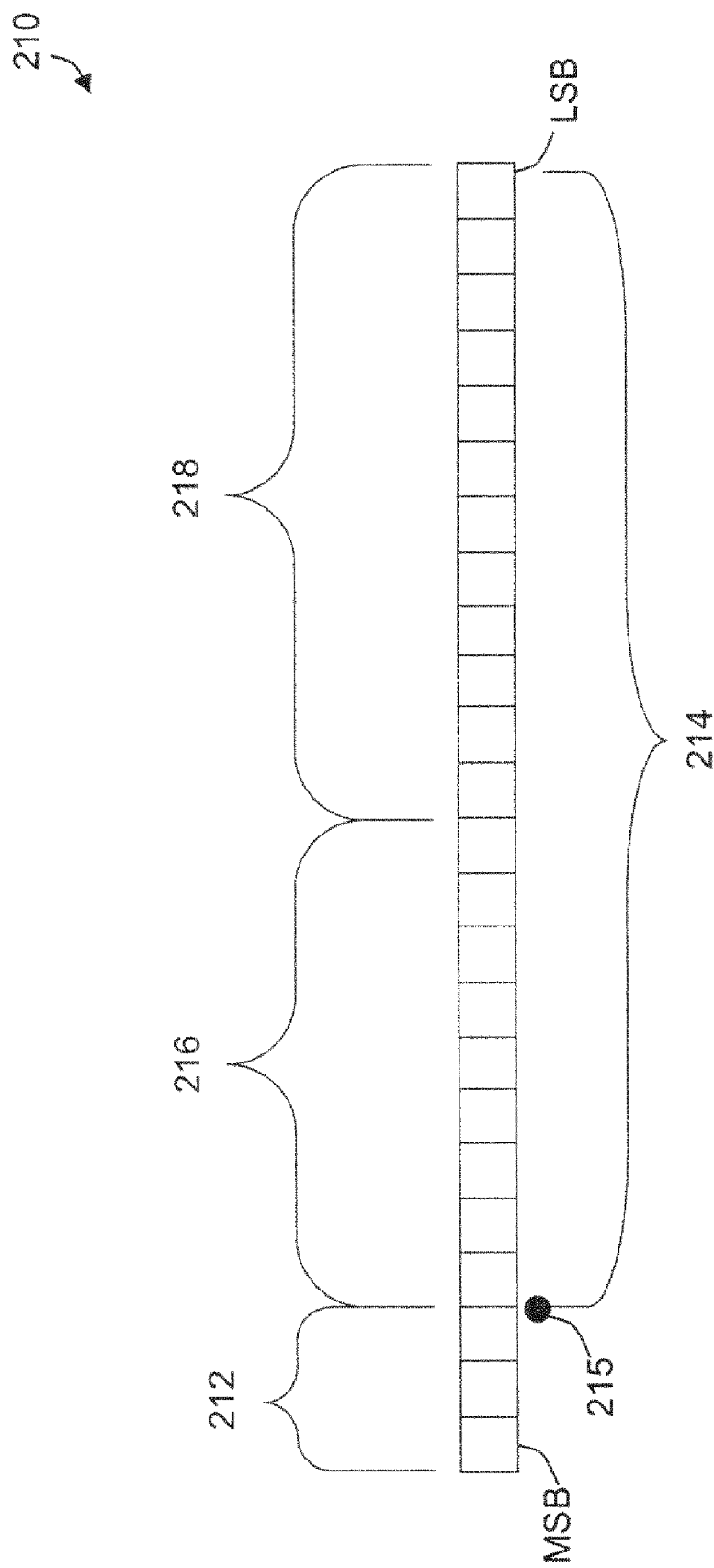
FIG. 4 is a schematic diagram illustrating an embodiment of a format of an interpolation factor.

The symbol ⊕ refers to the modulo operator. In a sample rate conversion system, the integer portion of p is interpreted as an input data look ahead, and the fractional portion is interpreted as the penetration into the current input clock cycle of the current output clock cycle. An embodiment of an interpolation factor 210 is illustrated in FIG. 4. The interpolation factor 210 may include a number of positional digits (e.g., bits for a binary system) arranged to include integer portion 212, and a fractional portion 214, separated by a radix point 215. The fractional portion 214 of the interpolation factor 210 is further subdivided into an upper fractional portion 216, including the more significant positional digits (e.g., upper bits) of the fractional portion 214 of the interpolation factor 210, and a lower fractional portion 218, including the less significant positional digits (lower bits) of the fractional portion 214 of the interpolation factor 210. The particular number of positional digits may vary depending upon an intended application. In some embodiments, such as those not including a look ahead buffer, the integer portion 212 is not included, as it is not necessary.

In a sample rate conversion system employing a polyphase filter and linear interpolator the interpolation factor 210 is implemented as a binary number, in which the upper bits 216 of the fractional portion of p 214 are interpreted as the polyphase sub-filter number, and the lower bits 218 of the fractional portion of p 214 are interpreted as the linear interpolation factor. The integer portion 212, when present, can be interpreted as a look ahead value. For an exemplary value of p having 24 bits accuracy, the integer portion 212 can include 3 bits, the most significant fractional portion 216 can include 9 bits, and the least significant fractional portion 218 can include 12 bits.

Figure 5:
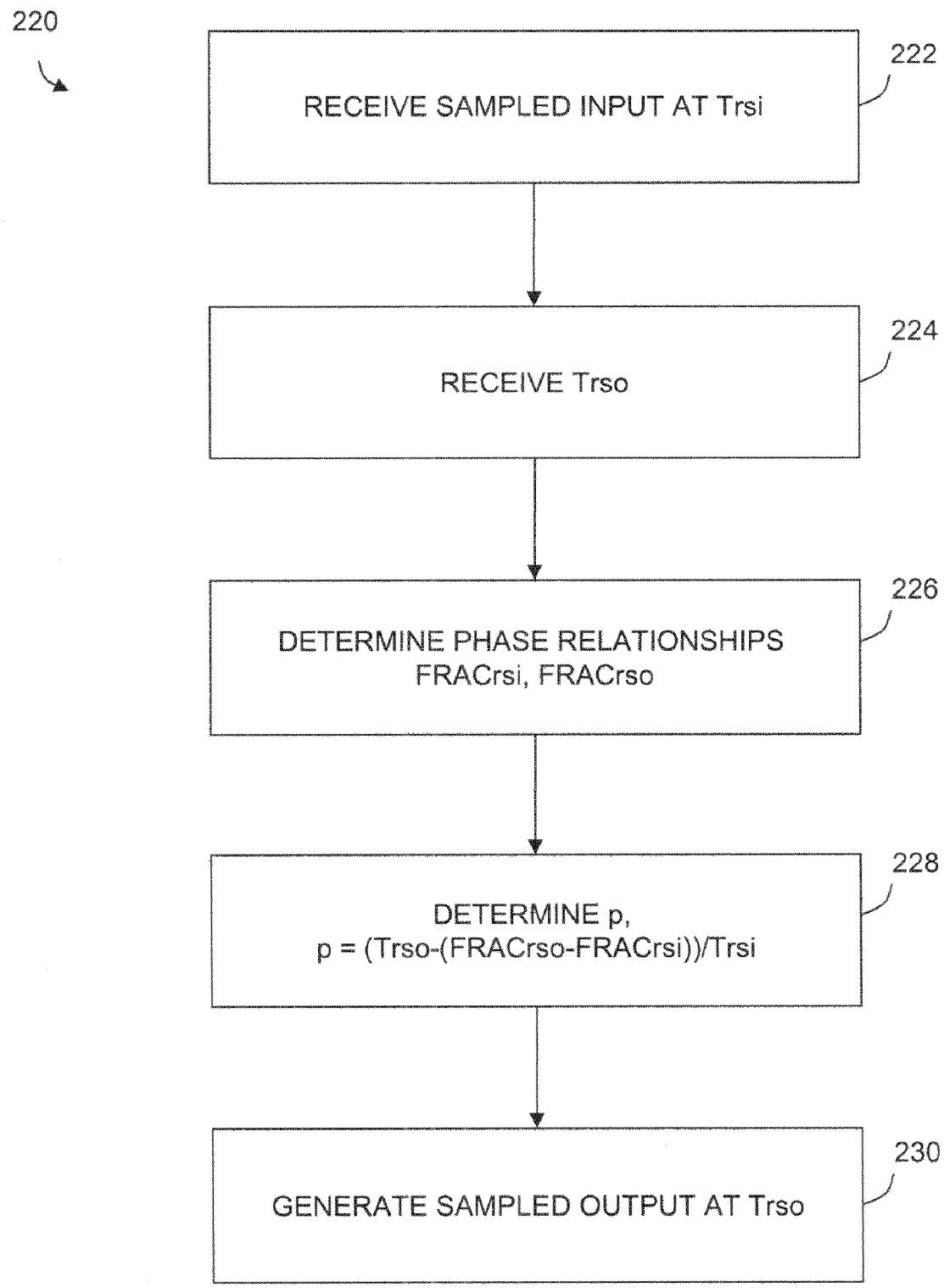
FIG. 5 is a flow diagram illustrating an embodiment of a process for accomplishing sample rate conversion.

Referring to FIG. 5, a flow diagram is shown illustrating an exemplary process 220 for accomplishing sample rate converter according to the present invention. In a first step 222, sampled input data at an input sample data rate $T_{RSI}$ is received. In a next step 224, a value related to a user output sample rate $T_{RSO}$ is received. In some embodiments, this value can be programmed by a user. At step 226, phase relationships are determined between each of the input and output sample rates or domains and a processor clock or domain. These phase relationships can be represented as the fractional values described above with respect to FIG. 3, $FRAC_{RSI}$, $FRAC_{RSO}$. In a subsequent step 228, an interpolation factor p is determined from the determined phase relationships $FRAC_{RSI}$, $FRAC_{RSO}$ and the input clock domain and output clock domain values $T_{RSI}$, $T_{RSO}$. Once obtained, the interpolation factor p can be used in a subsequent step 230 to generate sampled output data indicative of the input sampled data re-sampled to the output sample data rate.

Figure 6:
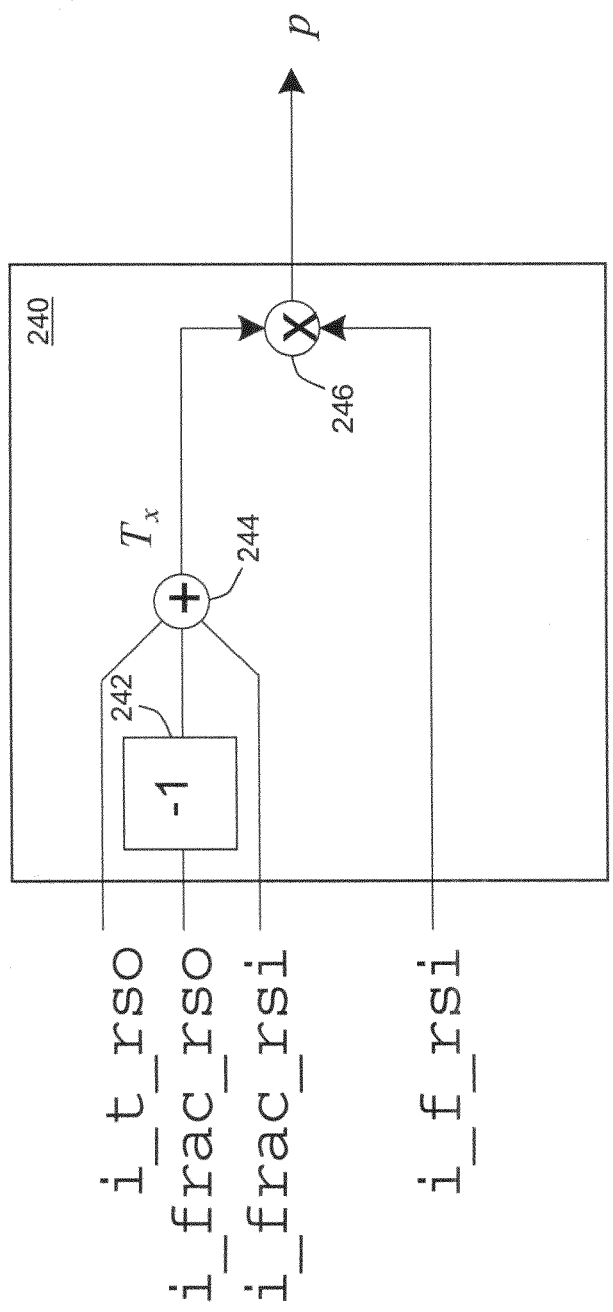
FIG. 6 is a block diagram illustrating an embodiment of a circuit for determining an interpolation factor as may be used in a sample rate converter.
Figure 10:
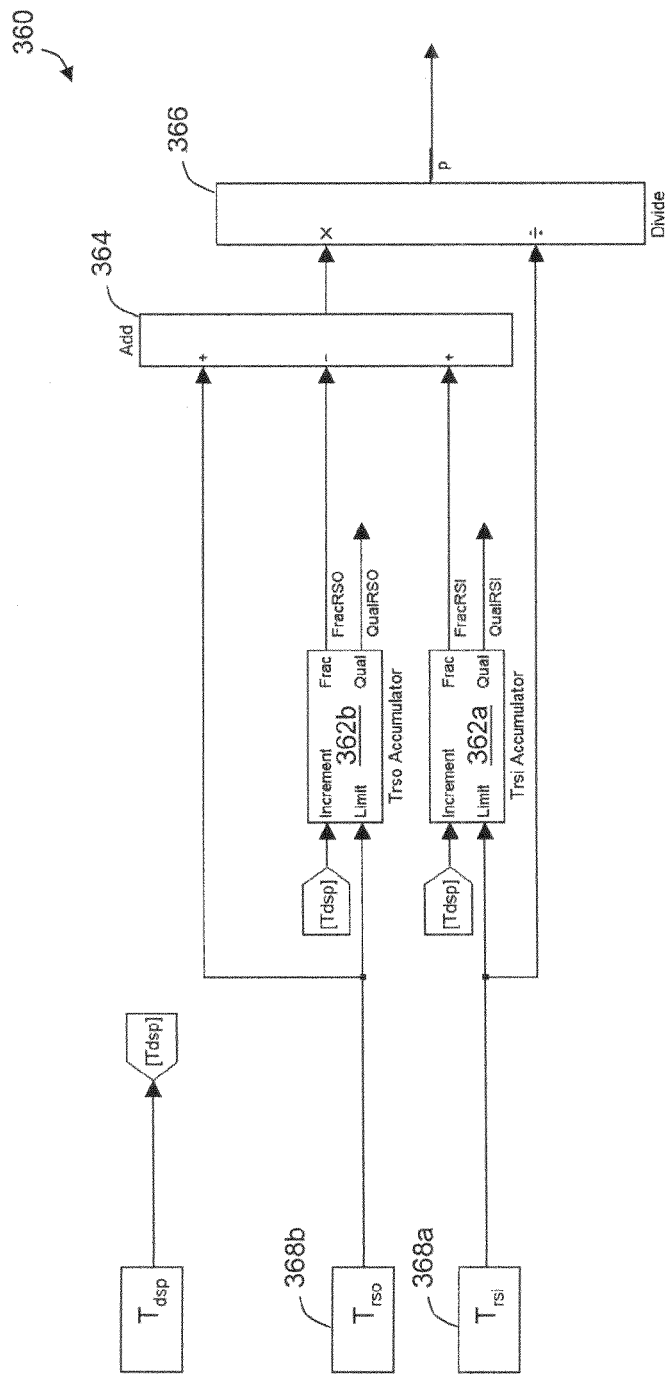
FIG. 10 is a schematic diagram illustrating an exemplary embodiment of the interpolation factor calculation circuit of either of FIG. 8 or FIG. 9.

Referring to FIG. 6, a block diagram of an exemplary circuit 240 is illustrated for determining an interpolation factor, such as the interpolation factor module 106 (FIG. 1). The interpolation factor circuit 240 includes a sign inverter 242 inverting a sign of a digital input value i_frac_rso, indicative of the $FRAC_{RSO}$ value. Operation of the sign inverter 242 would depend upon the nature in which the digital data is stored. The sign-inverted digital input value i_frac_rso ($FRAC_{RSO}$) is then combined with digital input value i_frac_rsi, indicative of $FRAC_{RSI}$ and digital input value i_t_rso, indicative of $T_{RSO}$ in a combiner, such as the summer 244 shown. The output value of the summer 244 is a digital word indicative of the value Tx (FIG. 3). The interpolation factor circuit 240 also includes a multiplier 246 multiplying the digital word indicative of the value Tx with a digital input value i_f_rsi, indicative of $F_{RSI}$. In some embodiments, the interpolation factor circuit 240 includes a divider instead of the multiplier 246. In those embodiments the i_f_rsi value would be replaced by the value $T_{RSI}$ which is the inverse of i_f_rsi as shown in FIG. 10. The value output from the multiplier (divider) is the interpolation factor p.

Figure 7:
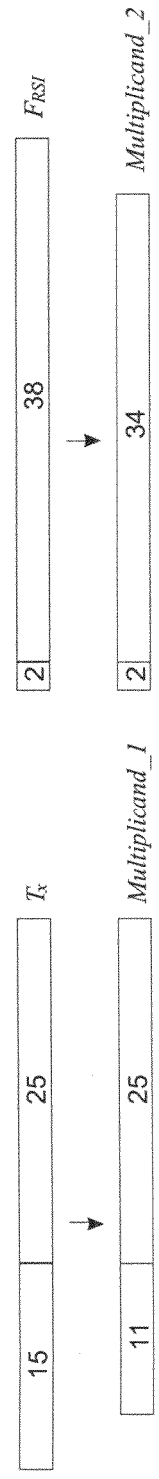
FIG. 7 is schematic representation of registers as may be used in the embodiment of the interpolation factor circuit of FIG. 6.

Illustrated in FIG. 7 are schematic representation of exemplary registers used in the interpolation factor circuit of FIG. 6. In some embodiments, the p ratio calculation has a 40 bit input resulting from the $T_x$ calculation, shown here with 15 integer bits and 25 fractional bits. The p-ratio calculation also has a 40 bit input from the $F_{RSI}$ value, of which 2 bits are integer, and 38 bits are fractional. A 25 bit accurate multiplication can be performed from these two 40 bit inputs, as shown. A hardware multiplier block, commercially available from Altera Corp., of San Jose, Calif., provides a 36 bit accurate multiplication, which is sufficient for this purpose.

Figure 8:
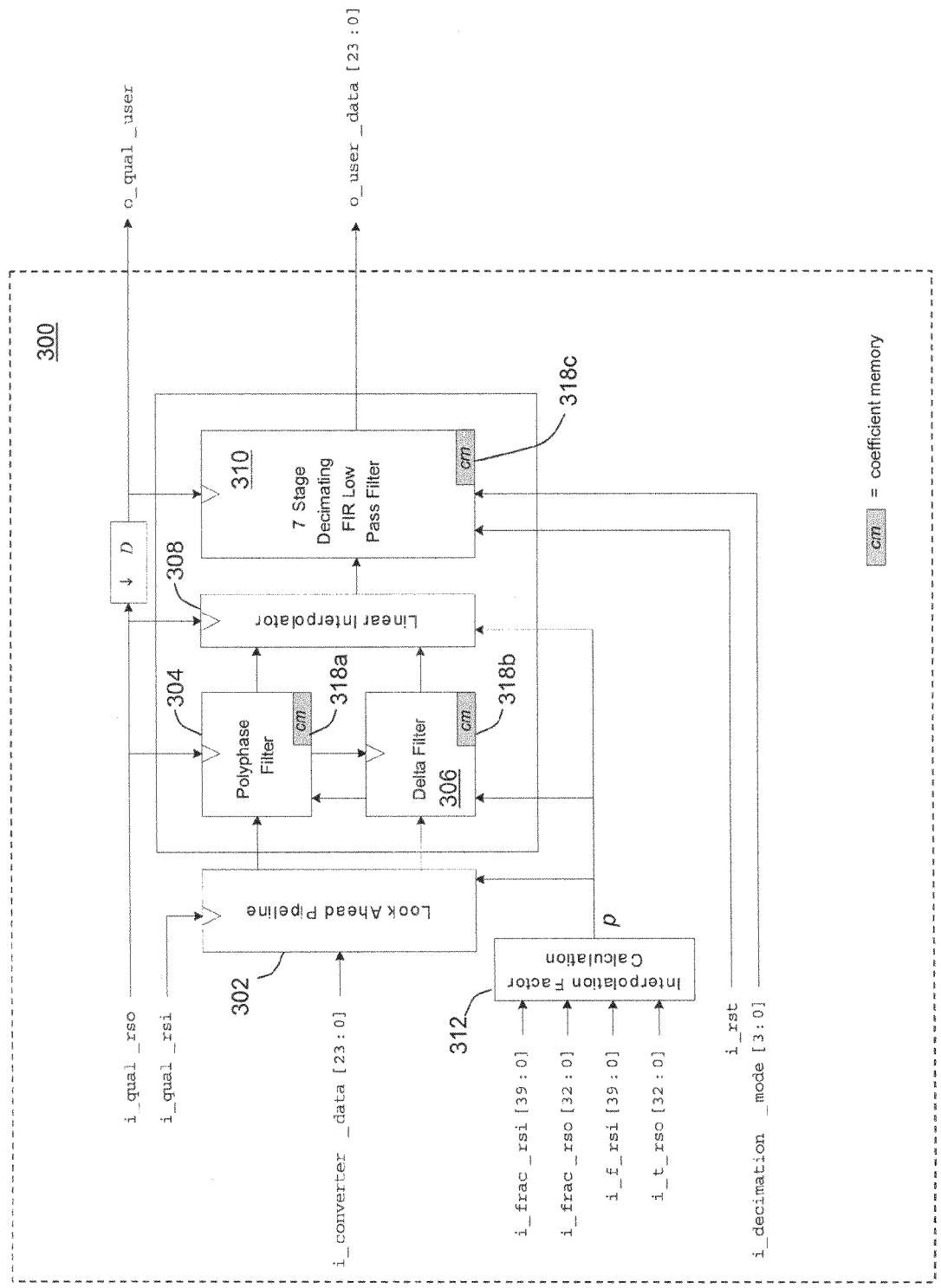
FIG. 8 is a block diagram illustrating an embodiment of a digitizing sample rate converter.

Referring to FIG. 8, a block diagram of an exemplary embodiment of a rate-converting digitizer 300 is shown. The rate-converting digitizer 300 includes a look-ahead buffer 302 receiving input sampled data, i_converter_data [23:03]. The look ahead buffer 302 includes one or more outputs coupled to one or more digital filters. For example, the look ahead buffer 302 includes a first output to a polyphase filter 304 and a second output to a delta filter 306. Each of the filters 304, 306 receives a respective input from the look-ahead buffer 302. Filter outputs are input to a linear interpolator 308, that provides an output to a decimating finite impulse response (FIR) low-pass filter. In some embodiments, portions of the rate-converting digitizer 300 are substantially duplicated forming more than one path, such as separate high-frequency and low-frequency paths, each tailored to respective operating parameters. When more than one paths are provided (not shown), a multiplexer or other suitable selection device is used to select among the different paths. In some embodiments, such a selection device can be configured to select a bypass path, substantially bypassing the rate-conversion processing.

Also included is an interpolation factor calculation module 312. The interpolation factor calculation module 312 receives four input digital values from one or more accumulators (not shown), such as: i_frac_rsi [39:0] indicative of $FRAC_{RSI}$; i_fra_rso [32:0], indicative of $FRAC_{RSO}$; i_f_rsi [39:0], indicative of $F_{RSI}$; and i_t_rso [32:0], indicative of $T_{RSO}$. The interpolation factor calculation module 312 provides an interpolation factor p as an output, calculated from the various input values. Any complexity of this function on the rate-converting circuit comes from the fact that the digitizer DSP clock can be different from the converter clock. In some embodiments, at least a portion of the interpolation factor is routed to the look ahead buffer 302, the polyphase filter 304, the delta filter 306, and the linear interpolator 308. The interpolation factor p represents the position of the output sample, or user, clock relative to the input sample, or converter (e.g., ADC) clock cycle. The upper bits of the fractional portion of the interpolation factor p can be used to select from among the polyphase and delta filter set 304, 306. The lower bits of the fractional portion of the interpolation factor p can be used to scale the linear interpolator 308. In the rate-converting digitizer 300, the integer portion of p is interpreted as data look ahead. Thus, an integer portion of the interpolation factor p is forwarded to the look ahead buffer 302, a first fractional portion, the most significant bits, of a fractional portion of the interpolation factor are routed to the polyphase and delta filters 304, 306, and a second fractional portion, the least significant bits of the fractional portion of the interpolation factor, are routed to the linear interpolator 308.

All or at least part of the rate-converting digitizer 300 can be implemented in a field-programmable gate array (FPGA) using digital signal processing (DSP) techniques known to those skilled in the art. One or more of the polyphase filter 304, the delta filter 306 and any other filters, such as a low-pass, or anti-aliasing filter can be digital filters. As digital filters, they are at least in part defined by filter coefficients. Such filter coefficients can be determined according to standard design practices for designing digital filters. For example, the polyphase filter 304 has 16 taps and 512 phase sets which results in 8192 coefficients. Local memory 318a, 318b, 318c (generally 318) for storing the filter coefficients is provided. The coefficient memory 318 layout can be optimized to make use of available memory blocks. These memory blocks will be treated in the FPGA design as read-only memory (ROM), so there will be no explicit control circuitry needed to load them.

The rate-converting digitizer 300 converts data from a fixed sample rate A/D converter by means of a M/N interpolating polyphase filter 304, linear interpolator 308, and decimating FIR filters. The theory and operation of polyphase filters, linear interpolators, and decimating FIR filters is well know to those skilled in the art. See, for example, Chapt. 10, *Introduction to Digital Signal Processing*, by J. G. Proakis and D. K. Manolakis, $2^{nd}$ ed., 1992, incorporated herein by reference in its entirety.

The look ahead pipeline 302, when provided, accommodates interpolation factor values greater than one. In some embodiments, the look ahead pipeline 302 simply stores one or more extra samples in a polyphase filter input delay line, and thus gives the option of looking into the "future" by one or more samples, when necessary. The integer part of the interpolation factor drives a multiplexer to select the appropriate data set.

The linear interpolator can be implemented by determining (e.g., calculating) the current polyphase filter output, and the output for one coefficient set into the future, and then calculating an average of these two values, weighed by the fine interpolation factor. In order to conserve multiplier resources, this function can be implemented as a delta filter 306, as shown. In this implementation the difference between coefficient sets is pre-calculated, resulting in a small difference value that can be handled with a small multiplier rather than a full size multiplier.

In some embodiments, an input analog signal is first band limited by an analog anti-aliasing filter (not shown). A design constraint on the analog filtering stop band is that substantially no A/D alias signals can show up below the highest decimating FIR stop band. In this case that frequency would be exactly A/D Nyquist.

Figure 9:
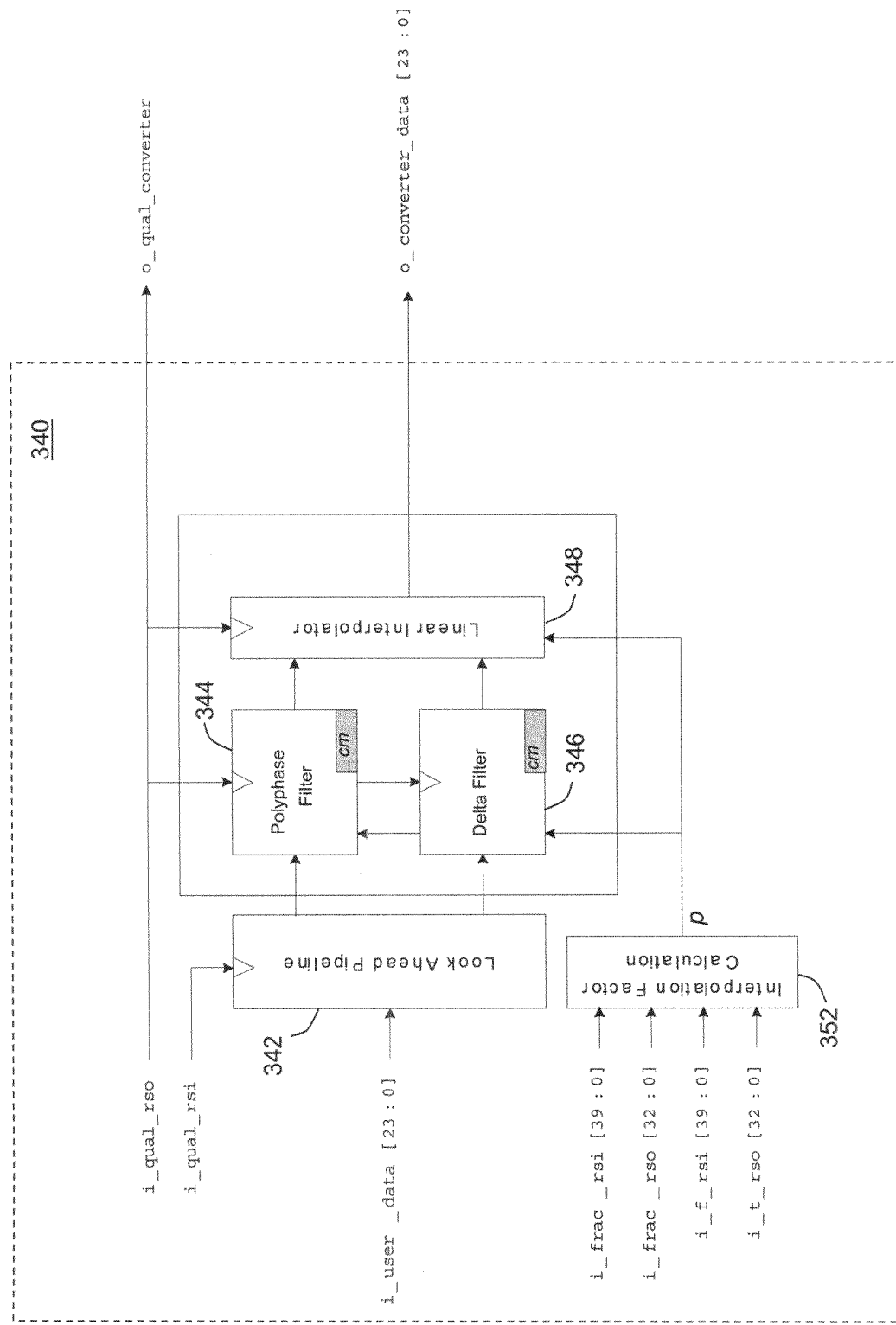
FIG. 9 is a block diagram illustrating an embodiment of a source sample rate converter.

A rate-converting source configuration 340 is illustrated in FIG. 9. A source configuration refers to sample conversion in which the rate-converting source 300 takes user data in at an $F_{user}$ rate and produces data at a modulation source, or converter rate. The theory and implementation of the source re-sampler are similar to that of the rate-converting digitizer 300 (FIG. 8), with at least three main differences. First, the number of filter taps may differ; the filter coefficient values may differ; and the fact that the re-sampler output frequency can be an integer sub-multiple of the DSP clock rate (e.g., $F_{DSP}=N\ F_{RSO}$). The last difference simplifies the rate-converting source architecture in that the interpolation factor p is a positive value, less than one, i.e., $0 \leq p < 1$.

In the exemplary embodiment, digital value i_user_data [23:0] is received, indicative of user data at rate $F_{user}$. The user data may be received in a look ahead pipeline 342, as illustrated. The source configuration 340 also includes a polyphase filter 344, a delta filter 346, a linear interpolator 348, and an interpolation factor calculation module 352, similar to the arrangement described above in relation to FIG. 8. Since the interpolation factor is less than one, there is no need to forward any integer portion to the look ahead pipeline 342. The upper and lower bits of the interpolation factor are distributed to the filter bank 344, 346 and the linear interpolator 348 as also described above in relation to FIG. 8. A re-sampled output digital signal is available at an output of the linear interpolator 348, referred to herein as o_converter_data [23:0].

A schematic diagram of an exemplary embodiment of a interpolation factor calculation module 360 is illustrated in FIG. 10. The module 360 includes input and output accumulators 362a, 362b, a three-input adder 364, and a divider 366. The module 360 receives separate digital input values indicative of the input sample period $T_{RSI}$ and the output sample period $T_{RSO}$. These sample period values $T_{RSI}$, $T_{RSO}$ can be stored in respective registers 368a, 368b. The module 360 also receives a digital input indicative of the system (i.e., DSP) clock $T_{DSP}$. The input sample period $T_{RSI}$ is input as a limit into the input accumulator 362a. The accumulator 362a is incremented according to the processing clock $T_{DSP}$. The input accumulator 362a computes a fractional output $FRAC_{RSI}$, providing it as an output to a first input of the adder 364. Similarly, the output sample period $T_{RSO}$ is input as a limit into the output accumulator 362b. The output accumulator 362b is also incremented according to the processing clock $T_{DSP}$. The output accumulator 362b computes a fractional output $FRAC_{RSO}$, providing it as an output to a second input of the adder 364. The second input of the adder 364 is sign-invert by techniques known to those skilled in the art, thereby subtracting the $FRAC_{RSO}$ value from a determined sum. The input value $T_{RSO}$ is input into a third input of the adder 364, such that the output of the adder 364 represents the value Tx (FIG. 3). In some embodiments, the output of the adder 364 is input into a first, dividend terminal of a divider circuit 366. The input value $T_{RSI}$ can be input into a second divisor input of the divider circuit 366, such that an output value of the divider circuit quotient represents the interpolation factor p.

Figure 11:
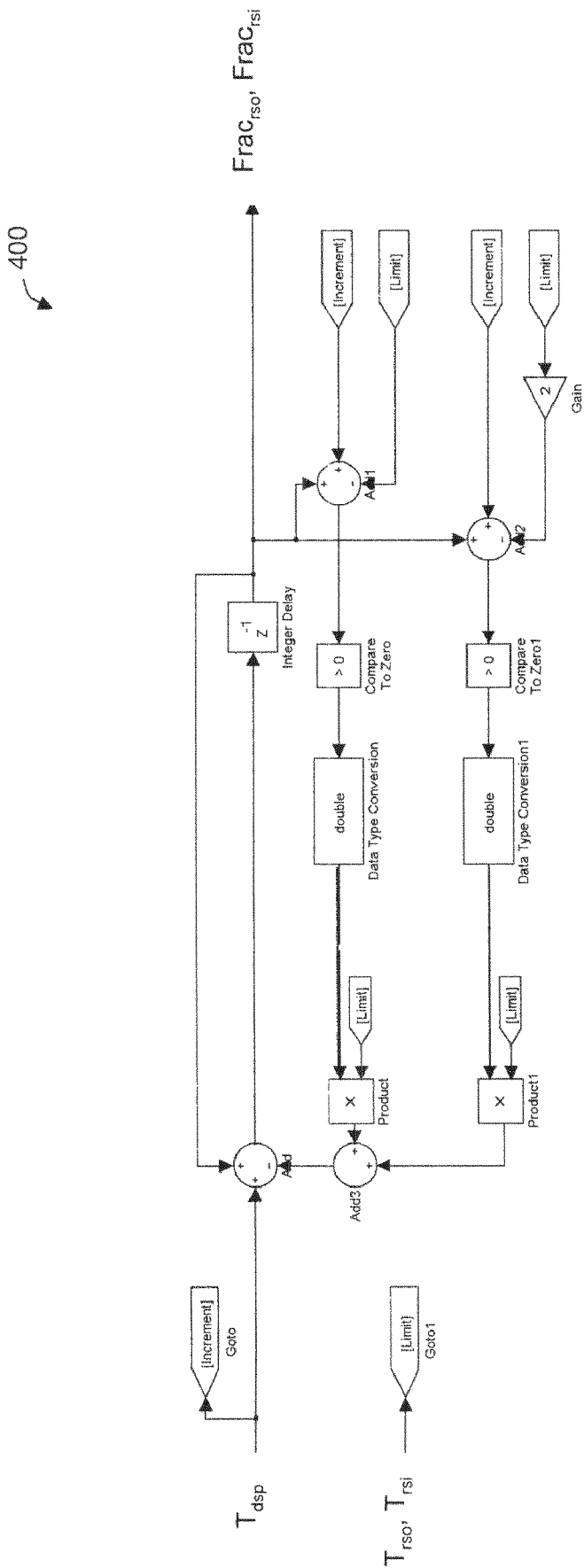
FIG. 11 is a schematic diagram illustrating an exemplary embodiment of the dual accumulators of FIG. 10.

FIG. 11 is a schematic diagram illustrating an exemplary embodiment of an accumulator 400, suitable for either of the accumulators 362a, 362b of FIG. 10. A first accumulator 400 (362a) receives $T_{RSI}$ as a limit value and $T_{DSP}$ as an incrementing value. The input values are processed according to the schematic illustration, yielding the value $FRAC_{RSI}$. Similarly, a second accumulator 400 (362b) receives $T_{RSO}$ as a limit value and $T_{DSP}$ as an incrementing value. The input values are processed according to the schematic illustration, yielding the value $FRAC_{RSO}$.

TABLE 1

| Signal | Definition |
|---|---|
| i_f_rsi | $(F_{RSI}/F_{ref})/\lceil \log_2(F_{RSI}/F_{ref}) \rceil$ |
| i_t_rso | $F_{ref}/F_{RSI}$ |
| i_frac_rsi | Time from the last RSI clock to the current DSP clock |
| i_frac_rso | Time from the last RSO clock to the current DSP clock |
| i_t_skew | $T_{skew}/T_{ref}$ |
| i_shift_multiplicand | $-|\log_2 (T_{RSO} + T_{RSI} + T_{skew,max})|$ |
| i_shift_product | $\lceil \log_2 F_{RSI} \rceil + |\log_2 (T_{RSO} + T_{RSI} + T_{skew,max})|$ |

The interpolation factor p can be computed to 21 bit accuracy (to the right of the binary point) with a range of 0 to 1.5. The p calculation is:

$$p = \frac{T_{RSO} - Frac_{RSO} + Frac_{RSI}}{T_{RSI}} \quad (6)$$

To avoid a divide operation, the inverse of $T_{RSI}$ can be pre-calculated.

$$p = (T_{RSO} - Frac_{RSO} + Frac_{RSI})(F_{RSI}) \quad (7)$$

Figure 13:
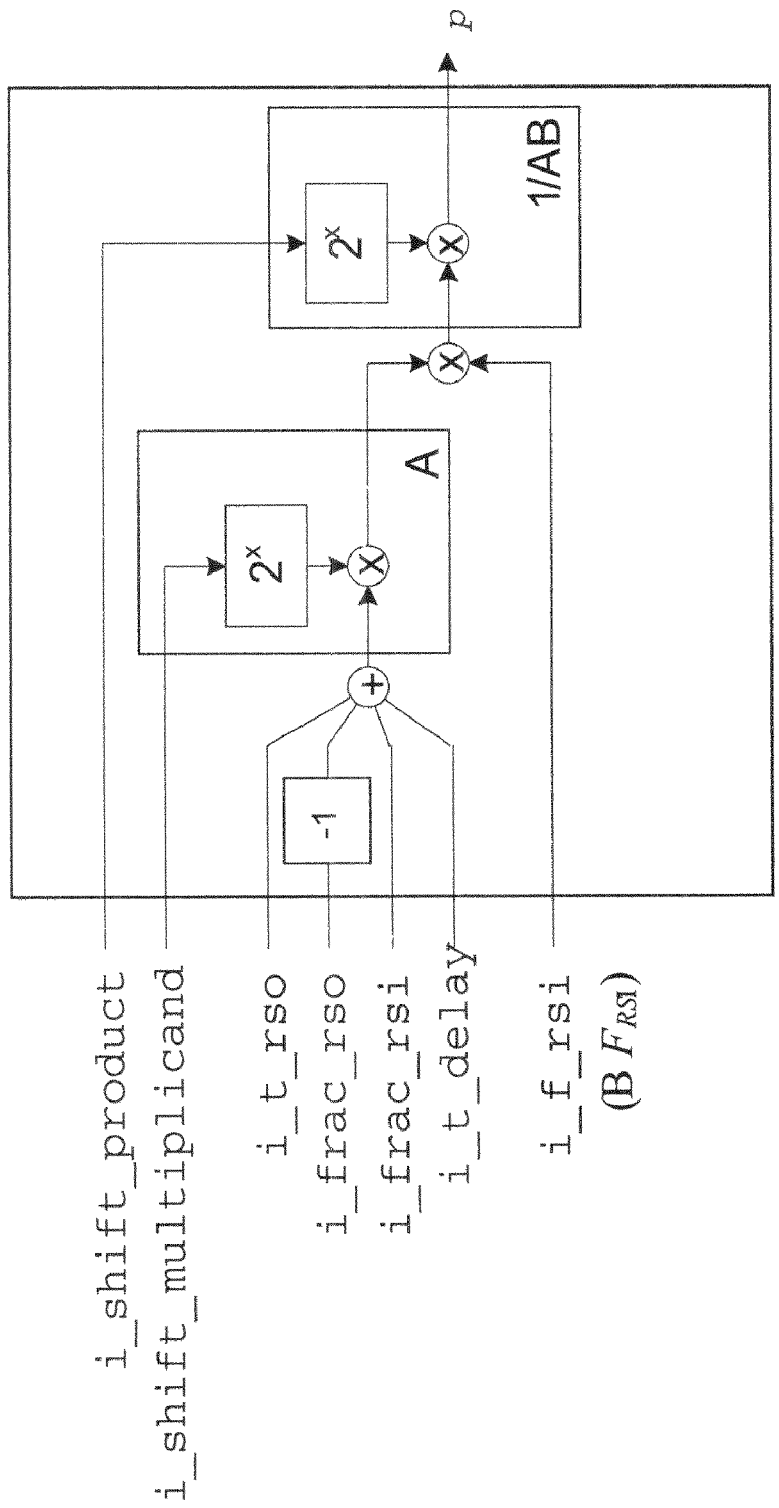
FIG. 13 is a block diagram illustrating an alternative embodiment of a calculator for determining an interpolation factor.

In applications where the range of input and output frequencies cover a large range, the interpolation factor calculation accuracy can be preserved by appropriate binary scaling of the interpolation factor factors, as shown in FIG. 13. The In some embodiments, an integer relationship between the DSP clock and the re-sampler output frequency ($F_{DSP}=N F_{RSO}$) leads to simplifications to the interpolation factor calculation. For the source, it is assurable that $0 \leq p < 1$, thus there is no need for a look ahead pipeline.

In the following example, a user generates a 40 MHz BW signal sampled at 200 MHz. The user data is zero padded to bring the sample rate to 102 GHz (512×200 MHz). The 200 MHz sample rate images are attenuated by the polyphase FIR filter. The signal is applied to the converter which contains an internal four times (4×) interpolation filter. The interpolated signal, now at a 533 MHz sample rate, is converted to analog with a zero order hold (sin x/x) response. Lastly, the analog low pass filter removes the converter rate sampling images.

In reference to the sample rate converter shown in FIG. 8, the linear interpolator 308 multiplies the output of the delta filter 306 by the lower bits of the linear interpolation factor (e.g., lower bits 218 shown in FIG. 4). The exemplary 14-bit linear interpolation factor ranges from [0, 1). In the exemplary embodiment, the output of the linear interpolator 308 is right shifted (and sign extended) by a number of bits, e.g., 7 bits. This is done to compensate for situations in which the delta filter coefficients were scaled up by the same amount (e.g., by a factor of $2^7$) before being stored in ROM 318b. The output data of this block is then added to the output of the main polyphase filter 304.

In some embodiments, the sample rate converter includes a bypass mode. When the bypass mode is set, at least a substantial portion of the sample rate converter including polyphase and decimating FIR filters is bypassed. Data enters the re-sampler at the $F_{A/D}$ rate, and then leaves the re-sampler at that same rate without any re-sampler processing. This mode provides user access to the raw ADC samples. Such access would be useful if the user were to perform an FFT on the captured data, the user would see frequency content up to converter Nyquist ($F_{A/D}/2$). Bypass mode also allows the user to employ the data rate converter in an under sampling manner, provided that the analog front-end allows this situation. A tone at the ADC input greater than converter Nyquist is aliased back into the band between DC and $F_{A/D}/2$. At this point, the data rate converter in bypass mode will not perform any processing on this captured data.

In some embodiments, the re-sampler low frequency input pipeline, data look ahead, delta filter, linear interpolation, and polyphase filter are implemented with a multi-cycle state machine. For example, one a multi-cycle state machine utilizes one 36×36 bit multiplier through which all of the signals can be processed. Such hardware efficiency is possible because the required output data rate is much slower than the FPGA DSP clock rate.

Figure 12:
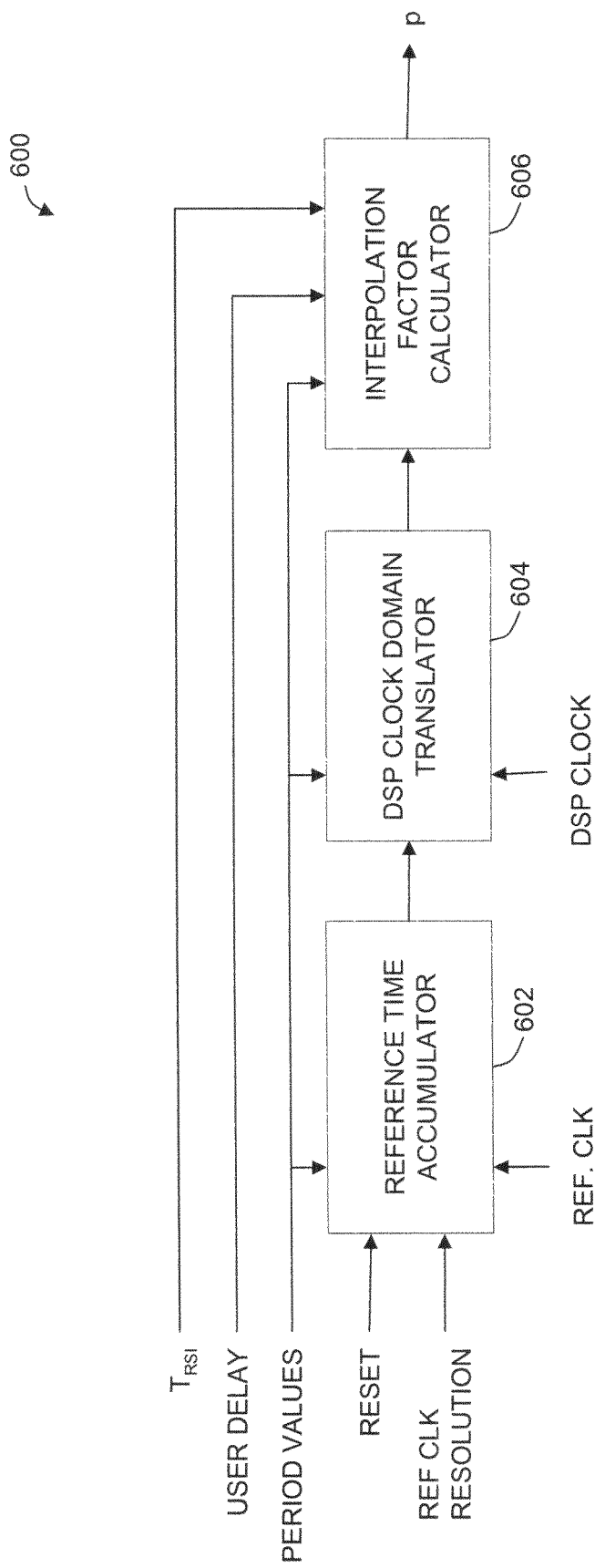
FIG. 12 is a block diagram illustrating an embodiment of the accumulator and interpolation calculator circuit including a second accumulator according to the present invention.

Referring to FIG. 12, a block diagram illustrating an alternative embodiment of an accumulator and interpolation calculator circuit 600. The phase accumulator 600 keeps track of the state of the real time converter clocks, the virtual user clocks, and the relative phases between these clocks. This state and relative phase information can be used by a sample rate converter 300, 340 (FIG. 8, FIG. 9) to convert the user's signals between the converter clock and user clock domains. The re-sampler 300, 340 consists of an input data pipeline with look ahead 302, 342, a polyphase FIR filter 304, 344, and a linear interpolator 308, 348 (FIG. 8, FIG. 9). The re-sampler 340 on a source channel (e.g., FIG. 9) takes data in at a virtual user rate and produces data out at a fixed converter rate. The re-sampler 300 on a capture channel (e.g., FIG. 8) takes data in at a fixed converter rate from the A/D converter and produces data out at a virtual user rate.

The accumulator can qualify re-sampler input data synchronous with the DSP clock. For example, there can be 0, 1, or 2 input data points qualified for every DSP clock. There can be 0 or 1 output data points qualified for every DSP clock. The accumulator 600 also tracks the state of the real time converter clocks. For example, the accumulator 600 tracks the state of each converter clock. A converter clock reset event resets the converter clock accumulators and the converter clocks so that these two are synchronized. This reset event also defines $t_0$. A converter clock reset event typically happens after a power cycle, or other catastrophic event. The phase accumulator must match the converter clock frequencies exactly.

The accumulator 600 tracks the state of the virtual user clock. The user clock can be reset, corresponding to time $t_0$. A reset of the user clock resets the user clock accumulators so that the exact run to run timing repeatability can be assured. Such user clock reset may occur at natural break points during normal operation, such as at the beginning of a test sequence in tester applications. The user clock can be tracked in terms of the fine resolution, or integer fractions thereof. Preferably, the user clock frequency programmability is binary fraction period based. In an exemplary embodiment, the user clock period has at least 10 ns/$2^{44}$ resolution, and the user clock range is 5 kHz to 400 MHz.

In some embodiments, a delay or skew value $T_{DELAY}$ can be added. Such a delay or skew value will effectively shift the analog waveform in time relative to a digital subsystem reference. Beneficially, such a delay value can be changed without requiring a subsequent reset of either the user clock or the converter clock. In some embodiments, the skew value has a range of 4 ns and a resolution of at least about 10 ns/$2^{32}$ (that is, 0.0023 fs). In some embodiments, the value of $T_{DELAY}$ can be set to zero, or ignored completely. For each re-sampler output data point, compute the re-sampler interpolation factor, $$p = (T_x + T_{DELAY})/T_{RSI}, \quad (8)$$

where $T_{RSI}$ is the re-sampler input clock period and $T_x$ is the time from the most recent re-sampler input clock that precedes the current DSP clock to the most recent re-sampler output clock in the current DSP clock cycle.

For applications in which tracking of the user clock is required in terms of a fine resolution value, it is necessary to have exact time accumulators operating in an exact underlying clock domain. Thus the user clock will be synthesized with constant period resolution. A method of translating the underlying events to the DSP clock domain is required. One such implementation provides a second set of (exact) phase accumulators 602 operating in the DSP clock domain that are synchronized to the underlying system clock domain at the coincidence point between the two domains. A second implementation would be to map every three underlying system clock domain user clock states directly into eight DSP domain user clock states.

The complication of having to calculate the interpolation factor from the states of two time accumulators comes from the fact that the DSP clock, re-sampler input, and re-sampler output frequencies are all different. This situation is simplified for embodiments in which the re-sampler output clock is the same as, or some simple multiple of the DSP clock.

The function of the underlying system clock domain user clock time accumulators is to keep track of the state of the user clocks in terms of underlying system clock cycles ($t_0$ being defined according to the value of an underlying system clock event plus a precision system clock phase value at the user clock reset event). At any given underlying system clock event the total number of fine resolution counts since $t_0$ needs to be known in order to be able to deterministically select a user clock cycle to match to a underlying system clock event. The time relative to the user clock also needs to be known as an input to the re-sampler interpolation factor calculation. For both of these needs, time from $t_0$ to the current underlying system clock event is actually measured.

$$t_N = N\, T_{ref} \quad (9)$$

where $t_N$ is time since $t_0$ at the $N^{th}$ underlying system clock event, N is the number of underlying system clock cycles since $t_0$, $T_{ref}$ is the period of the system clock, underlying system clock, i.e., 10 ns.

By expressing $t_N$ in terms of the user clock period, the fractional value FRAC can determine the time since the last user clock (as opposed to residue, which would be the time to the next user clock). This can be represented mathematically by $$\text{Frac}_{user} = t_N \oplus T_{user}, \quad (10)$$

in which $\text{FRAC}_{user}$ is the time from the last user clock, $T_{user}$ is the user clock period, and, $\oplus$ is the modulo operator. The method of measuring the time from the last user clock is preferable to the residue method for this application, because of the situation in which there are multiple virtual clock events per reference clock. In this case multiple residue values would need to be generated, whereas a single time from the last user clock (i.e., FRAC) value is sufficient.

In general, a user clock synthesized from a reference clock will be a rational fraction of the reference clock, that is, $$F_{user} = F_{ref} \frac{A}{B}, \quad (11)$$

or in terms of time, $$T_{user} = T_{ref} \frac{B}{A}. \quad (12)$$

The A term can be fixed so that $T_{ref}$ can be expressed as $A\, T_{resolution}$, thus combining equations (9), (10), and (12) gives $$\text{Frac}_{user} = NA T_{resolution} \oplus A T_{resolution} \frac{B}{A} \quad (13)$$

$$\text{Frac}_{user} = T_{resolution}(NA \oplus B) \quad (14)$$

The function $N\, A \oplus B$ is implemented in hardware as a modulo-B accumulator where the value $A = T_{ref}/T_{resolution}$ is pre-calculated and then accumulated on each underlying system clock cycle.

Since the re-sampler operations happen on system, or DSP clock cycles, the underlying system clock domain time accumulator values are mapped to the DSP clock domain. If this mapping is done without long term feedback then any errors introduced will not accumulate; thus the mapping can be approximate. The values shown below are for exemplary clock frequencies of a re-sampler instrument.

$$\text{Frac}'_{user} \approx T_{resolution}(N\, A' \oplus B) \quad (15)$$

$$A' = \frac{T_{DSP}}{T_{resolution}} = \frac{3}{8} A \text{ (source)} \quad (16)$$

$$A' = \frac{T_{DSP}}{T_{resolution}} = \frac{3}{9} A \text{ (digitizer)} \quad (17)$$

The converter clock time accumulators are the same as the user clock time accumulators except that the converter clock accumulators are reset by a converter clock reset event, rather than by the user clock reset event. The converter clock frequencies are much more limited than the user clock frequencies so a low resolution accumulator will be acceptable.

The case in which the re-sampler output clock is coincident with the DSP clock is treated as the virtual re-sampler clock occurring "after" the DSP clock, leading to the implication that FRAC values are always greater than zero.

In an exemplary embodiment, a user clock range requirement is 340 MHz down to 5 kHz. The user clock time accumulator must therefore be able to count $$\frac{1/(5 \text{ kHz})}{10 \text{ ns}} = 20{,}000 < 2^{15} - 1, \quad (18)$$

thus 14 bits are required to cover this range.

In some embodiments, user clocks are based on integer increments of period. In general one will not be able to achieve coherency between the analog and digital clocks, however one can get close enough for our applications. The areas of concern are (1) FFT outputs will have "leakage," and therefore give erroneous results, and (2) there will be a slow phase drift between analog and digital signals over time.

The effect of frequency accuracy on sine wave signal to noise ratio, as measured by a rectangular window FFT analysis is known to be approximately. See, for example, "When 'Almost' is Good Enough: a Fresh Look at DSP Clock Rates," Rosenfiled and Max, International Test Conference, 1988, incorporated herein by reference in its entirety.

$$SNR = \frac{T/2}{(T^3/24)(\omega_1 - \omega_2)^2} \qquad (19)$$

where T is the duration of the captured and analyzed signal, $\omega_1$ is the actual sine wave frequency, and $\omega_2$ is the ideal sine wave frequency, which can be expressed as $$SNR = \frac{3}{M^2 e^2 \pi^2} \qquad (20)$$

where M is the number of sine wave cycles analyzed, and e is the relative frequency error.

Tests conducted using a simulation software application indicated that the correlation is better than 0.1 dB. For a Nyquist frequency, about half of the noise power is concentrated in the M-1 bin, so there is an SFDR limitation of SNR+3 dB. With large FFTs (considering a practical limit of 64 k) and low noise instruments, The SFDR limitation due to non-coherent clocks should be better than 160 dB A user clock resolution of $10 \text{ ns}/2^{44}$ (5.6 E-22 seconds) is required to achieve 157 dB SNR. Using the 5.6 E-22 second user clock period resolution requirement, the worst case phase drift will be $$\text{Phase Drift} = \frac{Resoution}{2}\left(\frac{seconds}{cycle}\right) \text{Clock Frequency}\left(\frac{cycles}{second}\right) \qquad (21)$$

$$\text{Phase Drift} = \frac{5.6E-22}{2}\left(\frac{seconds}{cycle}\right) 400 \, E6 \left(\frac{cycles}{second}\right) = 114 \frac{fs}{second} \qquad (22)$$

or 6.8 ps/minute; 400 ps/hour.

The range of p is derived from the extreme values its contributing factors. Ignoring $T_{DELAY}$, the minimum p value comes from $$p_{MIN} = \frac{T_{x_{MIN}}}{T_{RSI}} \qquad (23)$$

$$T_{x_{MIN}} = T_{RSO} - \text{Frac}_{RSO_{MAX}} + \text{Frac}_{RSI_{MIN}} \qquad (24)$$

FRAC values range from (0, T], thus $p_{MIN}$ is nearly zero. The maximum value of p follows from the maximum value of $T_x$, and consequently the minimum value of $FRAC_{RSO}$. Namely, $$p_{MAX} = \frac{T_{x_{MAX}}}{T_{RSI}} \text{ and} \qquad (25)$$

$$T_{x_{MAX}} = T_{RSO} - \text{Frac}_{RSO_{MIN}} + \text{Frac}_{RSI_{MAX}} \qquad (26)$$

The minimum value of $FRAC_{RSO}$ occurs when the re-sampler output clock happens immediately before the DSP clock, then $FRAC_{RSO} = T_{RSO} - T_{DSP}$. Thus, $$p_{MAX} = \frac{T_{DSP} + T_{RSI}}{T_{RSI}}. \qquad (27)$$

Note that for the special case shown below in which $T_{RSO} = K \, T_{DSP}$, K being an integer, and with the re-sampler input clock $T_{RSO}$ and the DSP clock $T_{DSP}$ aligned in phase, $FRAC_{RSO}$ always equals $T_{RSO}$. In such a case:

$$p_{MAX} = \frac{T_{RSO} - T_{RSO} + T_{RSI}}{T_{RSI}} = 1. \qquad (28)$$

The interpolation factor p represents the relative phase of the re-sampler output clock to the re-sampler input clock. The re-sampler interpolates an output value by applying two of the all pass polyphase sub-filters (with incremental delay values bracketing the ideal relative phase) and then interpolating linearly between the two results. The SNR of such a re-sampler is known to be $$SNR_{filter} \geq \frac{80 I_{filter}^4}{\omega_x^4}, \qquad (29)$$

in which $I_{filter}$ is the number of polyphase sub-filters, and $\omega_x$ is the relative bandwidth, $2\pi BW_{user}/F_{RSI}$. See, for example, as described in *Introduction to Digital Signal Processing*, by J. G. Proakis and D. K Manolakis, $2^{nd}$ ed., 1992. Furthermore, the linear interpolator itself is in fact a polyphase filter with an SNR of $$SNR_{interpolator} \geq \frac{12 I_{interpolator}^2}{\omega_x^2}, \qquad (30)$$

Any automated test equipment, instrumentation, or communications system would benefit from this invention, because it leads to simplifications in the design and implementation of waveform digitizers, arbitrary waveform generators, modulation, and de-modulation systems.

While the preferred embodiment and various alternative embodiments of the invention have been disclosed and described in detail herein, it may be apparent to those skilled in the art that various changes in form and detail may be made therein without departing from the spirit and scope thereof.

It should be noted that the examples illustrated herein should in no way be interpreted as limited the spirit and scope of the present invention in any way. The specific examples and implementations are shown here for purposes of illustration only. And, while in the preferred embodiment the number of states in the filter may remain unaltered when modified to perform sample rate conversion, in alternative embodiments, additional states may be added without departing from the spirit and scope of the present invention.

What is claimed is:

1. A method for rate-converting sampled data comprising:
   receiving input data sampled according to an input sample clock;
   receiving a value indicative of an output sample clock differing from the input sample clock by a non-integer value;
   determining respective relationships between each of the input and output sample clocks and a processor clock, wherein each of the input and output sample clocks are independent from the processor clock;
   determining an interpolation factor as a function of the input sample clock, the output sample clock, and the determined relationships between each of the input and output sample clocks and the processor clock; and
   generating output data as a function of the input data and the interpolation factor, wherein the output data corresponds to the input data sampled according to the output sample clock, thereby rate converting the input data from the input sample clock to the output sample clock.

2. The method of claim 1, wherein the act of determining respectively relationships between each of the input and output sample clocks and the processor clock comprises:
   determining an input phase value indicative of delay between the input sample clock and the processor clock; and
   determining an output phase value indicative of a delay between the output sample clock and the processor clock.

3. The method of claim 2, wherein at least one of the acts of determining an input phase value and determining an output phase value comprises using an accumulator.

4. The method of claim 1, wherein the act of determining the interpolation factor comprises:
   determining a quantity as a difference between the output phase value and the input phase value and subtracting the determined difference from a period of the output sample clock; and
   dividing the determined quantity by a period of the input sample clock.

5. The method of claim 4, wherein the act of determining the quantity comprises:
   determining a difference between the output phase value and the input phase value;
   subtracting from a period of the output sample clock, a difference between the output phase value and the input phase value; and
   adding to the subtracted result a delay value, wherein the output sampled data is delayed in time proportional to the delay value.

6. The method of claim 5, wherein the delay value is selectable.

7. The method of claim 1, further comprising storing more than one sequential set of input sampled data in a tapped delay line, each set of input sampled data associated with a respective tap, different sequential sets of data being accessible through respective taps.

8. The method of claim 1, further comprising interpreting an integer portion of the interpolation factor as an input data look ahead.

9. The method of claim 1, further comprising making a polyphase filter selection according to an upper fractional portion of the interpolation factor.

10. The method of claim 9, further comprising interpreting a lower fractional portion of the interpolation factor as a linear interpolation scale factor.

11. The method of claim 1, wherein determination of the interpolation factor is repeated during different samples of at least one of the input sample clock, the output sample clock, and the processor clock.

12. The method of claim 11, wherein determination of the interpolation factor is repeated for each sample of the output sample clock.

13. An apparatus for converting sampled data from a first rate to a second rate comprising:
   a rate converter receiving input data sampled according to an input sample clock and configured to produce output data indicative of the input data sampled according to an output sample clock, the rate converter operating at a processing clock rate that is independent from either of the input sample clock and the output sample clock;
   an accumulator receiving the processing clock and configured to monitor a sate of the processor clock and to determine respective relationships of each of the input sample clock and the output sample clock to the processor clock; and
   an interpolation factor circuit in communication with the accumulator and the rate converter, the interpolation factor circuit receiving the respective relationships of each of the input sample clock and the output sample clock to the processor clock and configured to calculate an interpolation factor having at least an upper fractional portion and a lower fractional portion, the interpolation factor calculated as a function of the input sample clock, the output sample clock, and the processor clock, the rate converter configured to convert the input data to the output data as a function of the interpolation factor.

14. The apparatus of claim 13, wherein the accumulator includes a plurality of registers configured to store values related to the input sample clock, the output sample clock, and the respective relationships of each of the input sample clock and the output sample clock to the processor clock.

15. The apparatus of claim 14, wherein the accumulator comprises a modulo arithmetic function.

16. The apparatus of claim 13, wherein the rate converter comprises:
   a digital input filter in communication with the interpolation factor circuit, the digital input filter receiving the upper functional portion of the interpolation factor and configured to filter input data sampled according to an input sample clock;
   a linear interpolator in communication with an output of the digital input filter and with the interpolation factor circuit the linear interpolator receiving the lower fractional portion of the interpolation factor; and
   a low-pass filter in communication with an output of the linear interpolator, wherein data sampled input at an input sample clock is rate converted to corresponding output data sampled at the output sample clock.

17. The apparatus of claim 16, further comprising a look-ahead buffer between received input data and the digital input filter, the look-ahead buffer also in communication with the interpolation factor circuit and receiving an integer portion of the interpolation factor.

18. The apparatus of claim 16, wherein the digital input filter comprises a polyphase filter and a delta filter.

19. The apparatus of claim 13, further comprising at least one memory block configured to store filter coefficients for the digital input filter.

20. The apparatus of claim 13, further comprising a digital signal processor implementing at least one of the rate converter, the accumulator and the interpolation factor circuit.

21. An apparatus for converting sampled data from a first rate to a second rate comprising:

means for receiving input data sampled according to an input sample clock;

means for receiving a value indicative of an output sample clock differing from the input sample clock by a non-integer value;

means for determining respective relationships between each of the input and output sample clocks and a processor clock, wherein each of the input and output sample clocks are independent from the processor clock;

means for determining an interpolation factor as a function of the input sample clock, the output sample clock, and the determined relationships between each of the input and output sample clocks and the processor clock; and means for generating output data as a function of the input data and the interpolation factor, wherein the output data corresponds to the input data sampled according to the output sample clock, thereby rate converting the input data from the input sample clock to the output sample clock.

* * * * *

UNITED STATES PATENT AND TRADEMARK OFFICE
CERTIFICATE OF CORRECTION

| | | |
|---|---|---|
| PATENT NO. | : 7,719,446 B2 | Page 1 of 1 |
| APPLICATION NO. | : 12/271436 | |
| DATED | : May 18, 2010 | |
| INVENTOR(S) | : Daniel A. Rosenthal et al. | |

It is certified that error appears in the above-identified patent and that said Letters Patent is hereby corrected as shown below:

Title page item (75) Inventors: ..."Corey A. Nazarian" should read --Cory A. Nazarian--.

Claim 13, Column 18, line 20, "a sate of the processor clock" should read --a state of the processor clock--.

Signed and Sealed this

Thirteenth Day of July, 2010

David J. Kappos
*Director of the United States Patent and Trademark Office*